(12) United States Patent
Lapidus (10) Patent No.: US 6,700,401 B2
(45) Date of Patent: Mar. 2, 2004

(54) REDUCED NOISE LINE DRIVERS AND METHOD OF OPERATION

(75) Inventor: Peter D. Lapidus, Boulder, CO (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/796,660

(22) Filed: Feb. 28, 2001

(65) Prior Publication Data

US 2002/0118041 A1 Aug. 29, 2002

(51) Int. Cl.[7] ................. H03K 17/16; H03K 19/0175
(52) U.S. Cl. .............................. 326/27; 326/83
(58) Field of Search ....................... 326/26, 27, 57, 326/58, 83, 86

(56) References Cited

U.S. PATENT DOCUMENTS 5,248,906 A * 9/1993 Mahmood ............... 307/443
5,528,172 A * 6/1996 Sundstrom ............... 326/80
5,717,343 A * 2/1998 Kwong .................... 326/27
6,292,025 B1 * 9/2001 Okumura ................. 326/58

* cited by examiner

Primary Examiner—Daniel Chang (57) ABSTRACT

There is disclosed a reduced noise line driver for driving a signal line in an integrated circuit. The reduced-noise line driver comprises: 1) an N-type transistor having a source coupled to ground and a drain coupled to the signal line; 2) a P-type transistor having a source coupled to a power supply rail and a drain coupled to the signal line; 3) a first controller having an input for receiving an incoming signal and an output coupled to a gate of the N-type transistor; and 4) a second controller having an input for receiving the incoming signal and an output coupled to a gate of the P-type transistor, wherein the first controller and the second controller selectively switch the N-type transistor and the P-type transistor ON and OFF such that the N-type transistor and the P-type transistor are never ON simultaneously.

16 Claims, 6 Drawing Sheets

REDUCED NOISE LINE DRIVERS AND METHOD OF OPERATION

BACKGROUND OF THE INVENTION

In recent years, there have been great advancements in the speed, power, and complexity of integrated circuits, such as application specific integrated circuit (ASIC) chips, random access memory (RAM) chips, microprocessor (uP) chips, and the like. These advancements have made possible the development of system-on-a-chip (SOC) devices. A SOC device integrates into a single chip all (or nearly all) of the components of a complex electronic system, such as a wireless receiver (i.e., cell phone, a television receiver, and the like). SOC devices greatly reduce the size, cost, and power consumption of the system.

Reductions in power consumption are particularly important in SOC designs. SOC devices are frequently used in portable devices that operate on battery power. Since maximizing battery life is a critical objective in a portable device, it is essential to minimize the power consumption of SOC devices that may be used in the portable device. Furthermore, even if an SOC device is not used in a portable device, minimizing power consumption is still an important objective. The increased use of a wide variety of electronic products by consumers and businesses has caused corresponding increases in the electrical utility bills of homeowners and business operators. The increased use of electronic products also is a major contributor to the increased electrical demand that has caused highly publicized power shortages in California.

To minimize power consumption in electronic devices, particularly SOC devices, many manufacturers have reduced the voltage levels at which electronic components operate. Low power integrated circuit (IC) technology operating at +3.3 volts replaced IC technology operating at +5.0 volts. The +3.3 volt IC technology was, in turn, replaced by +1.6 volt IC technology in many applications, particularly microprocessor and memory applications.

However, as the operating voltage of an integrated circuit is reduced, the noise margins of the integrated circuit are also reduced. Thus, an integrated circuit operating at +1.6 volts has smaller noise margins than a circuit operating at +3.3 volts. During higher speed operation, the fast switching times of the N-type and P-type transistors that drive signal lines in an integrated circuit cause ground bounce and power supply noise that reduce the available noise margins. Furthermore, the ground bounce and power supply noise caused by the fast switching of transistors often does not go away during lower speed operation. At lower speeds, the line drivers still switch rapidly from Logic 1 to Logic 0 and vice versa, only the periods between transitions are extended.

Therefore, there is a need in the art for system-on-a-chip (SOC) devices and other large scale integrated circuit devices that are capable of operating with low noise margins. In particular, there is a need in the art for SOC devices and other large scale integrated circuit devices that have reduced ground bounce and power supply noise caused by the high-speed switching of logic gates. More particularly, there is a need for SOC devices and other large scale integrated circuit devices that incorporate line drivers that have reduced ground bounce and power supply noise caused by the high-speed switching of P-type and N-type transistors.

SUMMARY OF THE INVENTION

To address the above-discussed deficiencies of the prior art, it is a primary object of the present invention to provide, a reduced noise line driver for driving a signal line in an integrated circuit. According to an advantageous embodiment of the present invention, the reduced-noise line driver comprises: 1) an N-type transistor having a source coupled to ground and a drain coupled to the signal line; 2) a P-type transistor having a source coupled to a power supply rail and a drain coupled to the signal line; 3) a first controller having an input for receiving an incoming signal and an output coupled to a gate of the N-type transistor; and 4) a second controller having an input for receiving the incoming signal and an output coupled to a gate of the P-type transistor, wherein the first controller and the second controller selectively switch the N-type transistor and the P-type transistor ON and OFF such that the N-type transistor and the P-type transistor are never ON simultaneously.

According to one embodiment of the present invention, the first controller comprises a comparator capable of determining when the incoming signal is a Logic 1 and, in response to the determination, turning ON the N-type transistor.

According to another embodiment of the present invention, the first controller further comprises circuitry for turning ON the N-type transistor using a ramp function.

According to still another embodiment of the present invention, the first controller further comprises delay circuitry for delaying the ramp function by a predetermined delay period after the comparator has determined the incoming signal is a Logic 1.

According to yet another embodiment of the present invention, the first controller further comprises delay circuitry for delaying the ramp function by a predetermined delay period after the incoming signal has switched from a Logic 0 to a Logic 1.

According to a further embodiment of the present invention, the second controller comprises a comparator capable of determining when the incoming signal is a Logic 0 and, in response to the determination, turning ON the P-type transistor.

According to a still further embodiment of the present invention, the second controller further comprises circuitry for turning ON the P-type transistor using a ramp function.

According to a yet further embodiment of the present invention, the second controller further comprises delay circuitry for delaying the ramp function by a predetermined delay period after the comparator has determined the incoming signal is a Logic 0.

According to still another embodiment of the present invention, the second controller further comprises delay circuitry for delaying the ramp function by a predetermined delay period after the incoming signal has switched from a Logic 1 to a Logic 0.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 6, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged data processing system.

Figure 1:
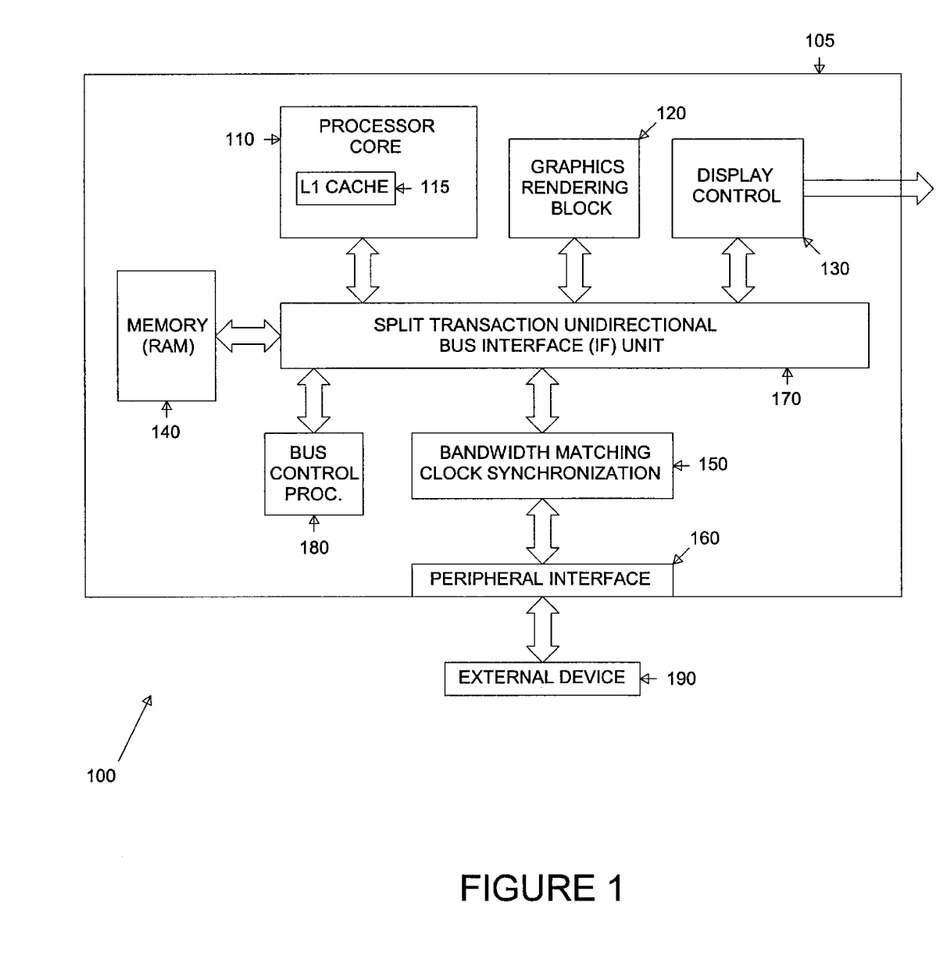
FIG. 1 illustrates a data processing system that comprises an exemplary system-on-a-chip (SOC) device according to one embodiment of the present invention.

FIG. 1 illustrates processing system 100, which comprises exemplary system-on-a-chip (SOC) device 105 according to one embodiment of the present invention. SOC device 105 is a single integrated circuit comprising processor core 110, graphics rendering block 120, (optional) display control circuit 130, memory 140, bandwidth matching-clock synchronization interface 150, peripheral interface 160, split transaction, unidirectional bus interface (IF) unit 170 (or bus IF unit 170), and bus control processor 180. Processor core 110 contains internal level one (L1) cache 115. Peripheral interface 160 communicates with external device 190.

Processing system 100 is shown in a general level of detail because it is intended to represent any one of a wide variety of electronic products, particularly consumer appliances. Display controller 130 is described above as optional because not all end-products require the use of a display. Likewise, graphics rendering block 120 may also be optional.

For example, processing system 100 may be a printer rendering system for use in a conventional laser printer. Processing system 100 also may represent selected portions of the video and audio compression-decompression circuitry of a video playback system, such as a video cassette recorder or a digital versatile disk (DVD) player. In another alternative embodiment, processing system 100 may comprise selected portions of a cable television set-top box or a stereo receiver.

Bus IF unit 170 provides high-speed, low latency communication paths between the components coupled to bus IF unit 170 Each component coupled to bus IF unit 170 is capable of initiating or servicing data requests via four unidirectional bus interfaces: two request buses and a two data buses. The request bus contains address lines, byte enable lines (32-bit or 64-bit data reads), cycle type lines, and routing information for transactions. The data bus contains data lines, byte enable lines (for data writes), completion status lines, and routing information to associate the data bus packets with the appropriate request bus packet. As noted, the four buses are unidirectional and point-to-point to minimize loading and timing variations. In addition, bus IF unit 170 provides a diagnostic bus, power management controls, clocks, reset signals, and a scan interface.

Bus IF unit 170 implements a transaction protocol that defines the mechanism for transferring packets between devices coupled to bus IF unit 170. In addition, the transaction protocol defines the control for clocks and power management. The packet protocol standardizes the system level interactions between devices coupled to bus IF unit 170. The hardware requirements for mapping transactions, arbitrating packets, and maintaining coherency is specified in the packet protocol.

Bandwidth matching-clock synchronization interface 150 comprise a queue that bridges ports on bus IF unit 170 that have different widths or different frequencies, or both. Bus control processor 180 controls certain operations of bus IF unit 170 related to clock timing, power management, and diagnostic features.

Peripheral interface 160 is a bus device used for chip-to-chip commination between SOC device 105 and an external peripheral device, such as external device 190.

Figure 2:
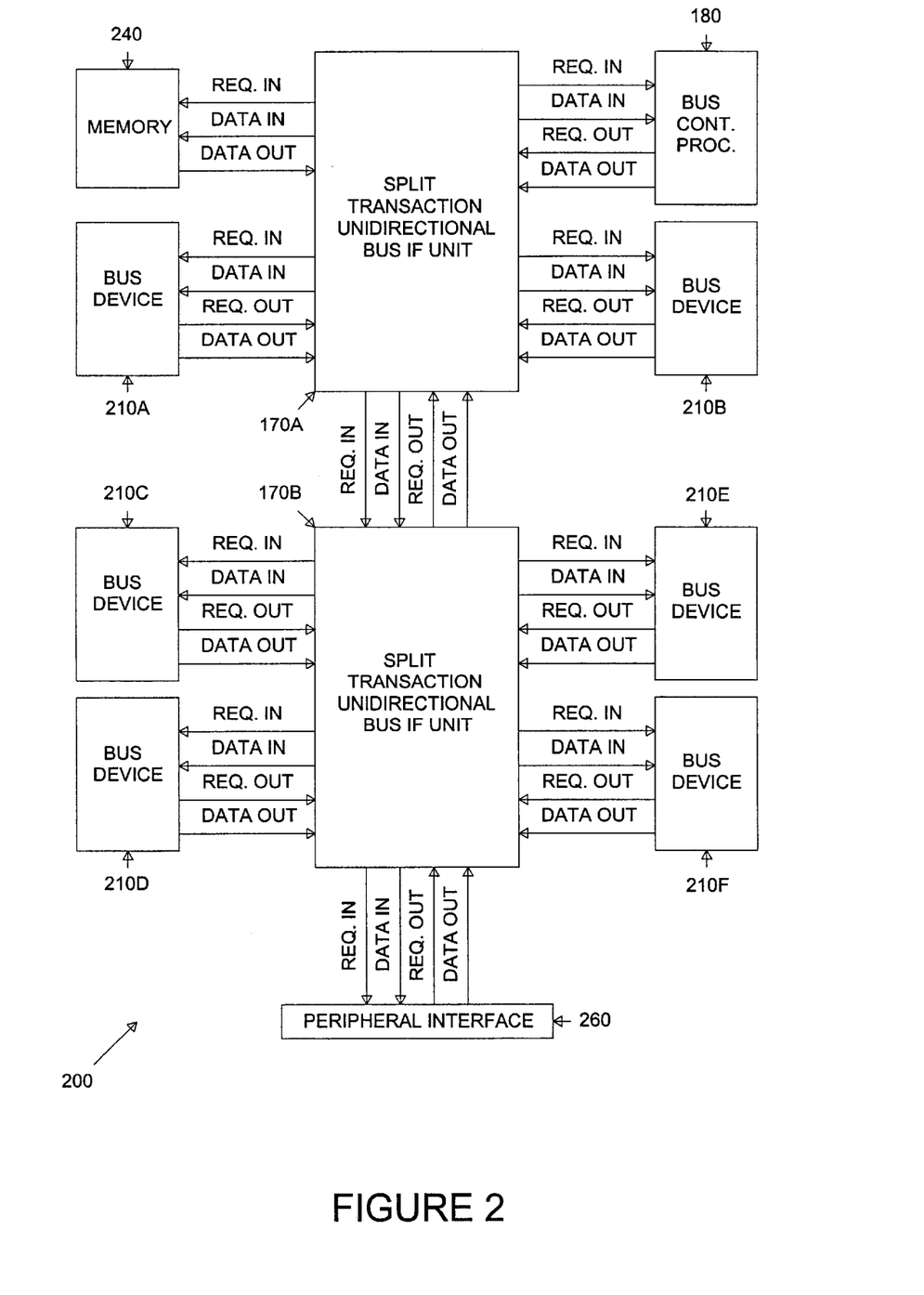
FIG. 2 illustrates a high-level signal interface of the interconnection of exemplary split transaction, unidirectional bus interface (IF) unit and other bus devices in FIG. 1 according to the principles of the present invention.

FIG. 2 illustrates high-level signal interface 200, which defines the interconnection of exemplary split transaction, unidirectional bus interface (IF) unit and other bus devices in FIG. 1 according to the principles of the present invention. In the illustrative embodiment, a first split transaction, unidirectional bus interface unit (i.e., bus IF unit 170A) is coupled to, and transfers data between, memory 240, bus control processor 180, bus device 210A, bus device 210B, and a second split transaction, unidirectional bus interface unit (i.e., bus IF unit 170B). Bus IF unit 170B is coupled to, and transfers data between, bus devices 210C–210F, peripheral interface 260, and bus IF unit 170A.

In the illustrative embodiment, bus IF unit 170A uses separate interfaces to transfer data with bus device 210A, bus device 210B, bus control processor 180, and bus IF unit 170B. Each of the separate interfaces comprises four unidirectional buses. The unidirectional buses in each interface are REQUEST OUT, REQUEST IN (abbreviated REQ. OUT and REQ. IN, respectively), DATA OUT, and DATA IN. Similarly, bus IF unit 170B uses separate interfaces to transfer data with bus devices 210C–210F, peripheral interface 260, and bus IF unit 10A.

A data read request from a requesting one of bus devices 210A–210F is transmitted from bus IF unit 170A or bus IF unit 170B to a receiving one of bus devices 210A–210F that has the requested data via one of the REQUEST IN buses. The requested data is then transmitted out on the corresponding DATA OUT bus. Similarly, a write request from a requesting one of bus devices 210A–210F is transmitted from bus IF unit 170A or bus IF unit 170B to a receiving one of bus devices 210A–210F to which the data is to be written via one of the REQUEST IN buses. The incoming data is then received on the corresponding DATA IN bus. A requesting one of bus devices 210A–210F transmits read and write requests on the REQUEST OUT bus.

For example, bus device 210A may write data to bus device 210B by first transmitting to bus IF unit 170A a write data request on the REQUEST OUT bus coupling bus device 210A and bus IF unit 170A. Bus device 210A also transmits the write data to bus IF unit 170A on the DATA OUT bus coupling bus device 210A and bus IF unit 170A. Next, bus IF unit 170A transmits the write data request to bus device 210B on the REQUEST IN bus coupling bus device 210B and bus IF unit 170A. Bus IF unit 170A also transmits the write data to bus device 210B on the DATA IN bus coupling bus device 210B and bus IF unit 170A.

Furthermore, a bus device coupled to bus IF unit 170A can read data from, or write data to, a bus device coupled to bus IF unit 170B (including peripheral interface 260) via the four bus interface connecting bus IF unit 170A and bus IF unit 170B. Similarly, a bus device coupled to bus IF unit 170B (including peripheral interface 260) can read data from, or write data to, a bus device coupled to bus IF unit 170A via the four bus interface connecting bus IF unit 170A and bus IF unit 170B.

In the exemplary embodiment in FIG. 2, bus IF unit 170A is couple to memory 240 by only three buses, namely the REQUEST IN bus, the DATA OUT bus, and the DATA IN bus. A REQUEST OUT bus is not used to couple bus IF unit 170A and memory 240 because memory 240 does not normally initiate read operations and write operations.

Figure 3:
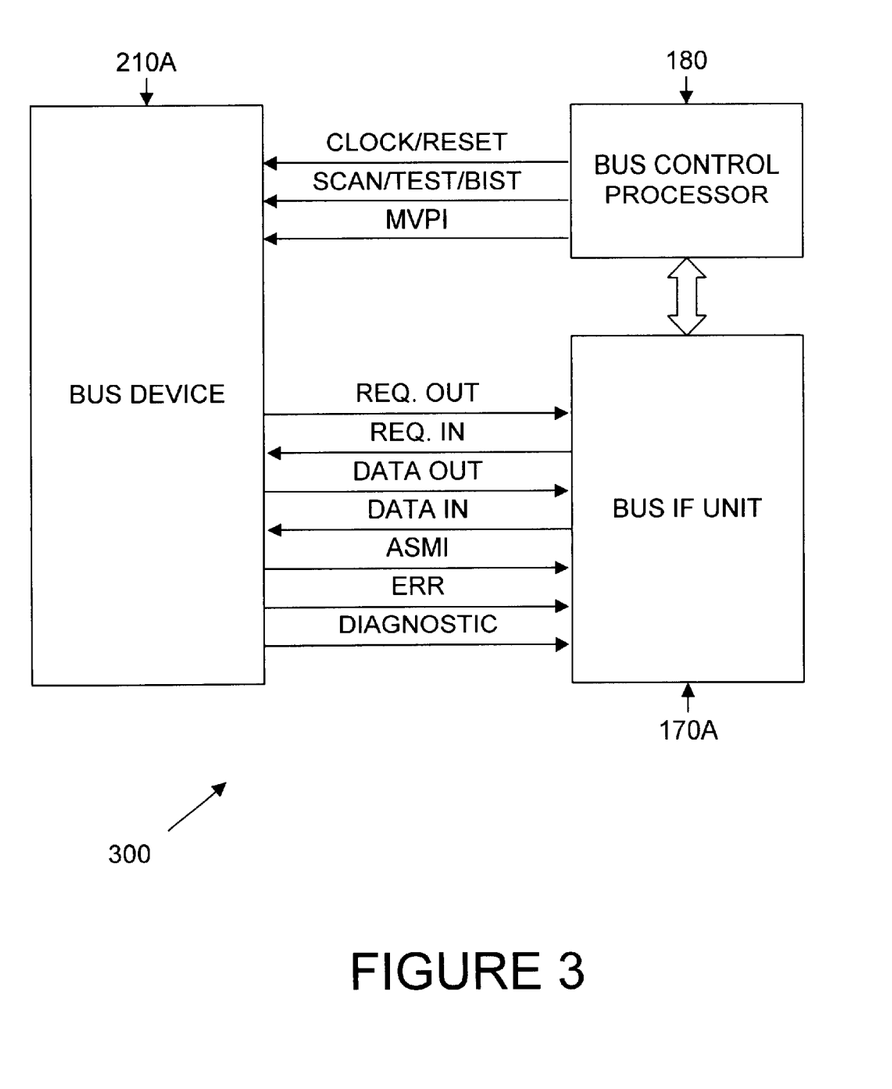
FIG. 3 illustrates the signal interface which defines the interconnection of the exemplary bus IF unit, bus control processor, and one bus device in FIG. 2 in greater detail according to one embodiment of the present invention.

FIG. 3 illustrates in greater detail signal interface 300, which defines the interconnection of bus IF unit 170A, bus control processor 180, and bus device 210A according to one embodiment of the present invention. As before, bus IF unit 170A is coupled to bus device 210A by four independent buses (REQUEST OUT, REQUEST IN, DATA OUT, and DATA IN). Bus IF unit 170A also is coupled to bus device 210A by several control signal lines, namely ASMI, ERR, and DIAGNOSTIC. Each port has an independent interface. Thus, there are no tri-state signal lines.

Bus device 210A initiates requests on the REQUEST OUT bus when bus device 210A operates as a master and receives requests on the REQUEST IN bus when bus device 210A operates as a slave. Write data and responses are initiated on the DATA OUT bus and transmitted to the target bus device (master or slave) on the DATA IN bus. All the buses have a similar control interface. The data bus width (e.g., 16 bits, 32 bits) may vary based on the bandwidth desired for a given application. The asynchronous system management interrupt (ASMI) signal provides a mechanism for bus device 210A to request a system management interrupt. The error (ERR) signal indicates an error that is not associated with a particular bus transfer.

Bus device 210A receives clock and reset (CLOCK/RESET) signal from bus control processor 180. Bus control processor 180 also provides control signals for performing scan, test, and/or built-in self test (BIST) functions. Optionally, bus device 210A may provide a DIAGNOSTIC bus that is coupled to bus IF unit 170A. The DIAGNOSTIC bus is group of important internal signals selected by the module designer. The DIAGNOSTIC bus may be multiplexed with diagnostic buses from other bus devices in bus IF unit 170A.

As is well known, the speed at which the components in SOC device 105 operate is determined in part by the voltage levels of the power supply rails in those components. A higher supply voltage drives larger currents through the transistors in the logic gates in the components in SOC device 105. This results in faster switching times and allows a higher operating frequency to be used. Unfortunately, a higher operating voltage also increases power consumption. This is particularly true with respect to data buses that interconnect, or are internal to, the components in SOC device 105. Long signal lines must be driven at relatively high voltages (and high power consumption) in order to switch rapidly between a high voltage (Logic 1) and a low voltage (Logic 0) during high frequency operations. However, when it is not necessary to operate at high frequency, a lower power supply voltage would be sufficient. In order to minimize the power consumed by the components of SOC device 105, including especially bus IF unit 170, peripheral interface 160, memory 140, and bandwidth matching-clock synchronization interface 150, the present invention provides a unique apparatus and a related method for adjusting the power supply voltage levels that are applied to selected line drivers in SOC device 105.

Figure 4:
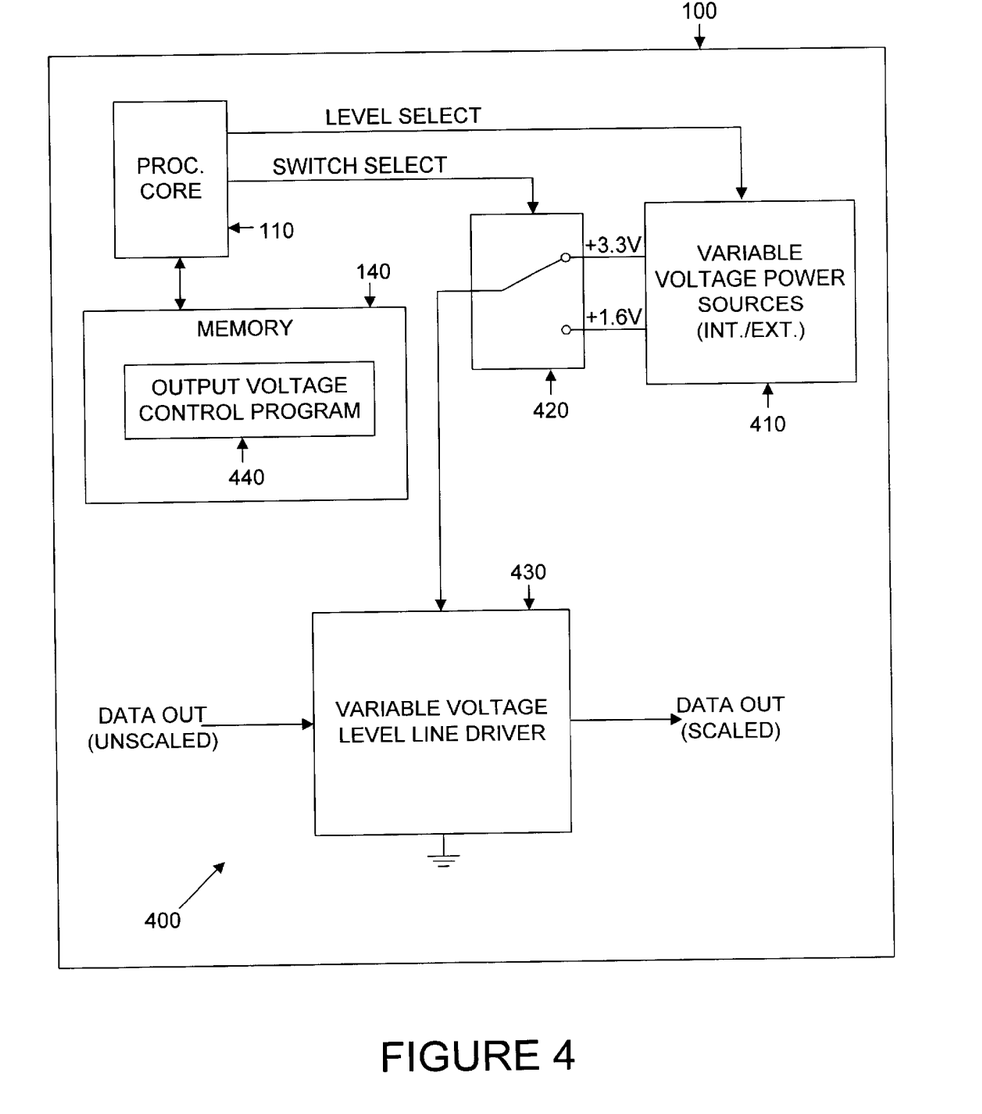
FIG. 4 illustrates exemplary power level adjusting circuitry according to one embodiment of the present invention.

FIG. 4 illustrates power level adjusting circuitry, generally designated 400, according to one embodiment of the present invention. Power level adjusting circuitry 400 comprises variable level power sources 410, switch 420, variable voltage level line driver 430, processor core 110, and memory 140, which contains output voltage control program 440. Variable voltage level line driver 430 receives the unscaled DATA OUT signal and outputs a scaled DATA OUT signal. Variable voltage level line driver 430 is intended to represent any circuit that drives a data, address, or control line in SOC device 105. As will be discussed below in greater detail, the amplitude of the scaled DATA OUT signal may be adjusted according to the speed at which variable voltage level line driver 430 is operating. During times when variable voltage level line driver 430 is driving the scaled DATA OUT signal at high frequency, the voltage level of variable voltage level line driver 430 may be increased to, for example, +3.3 volts. During times when variable voltage level line driver 430 is driving the scaled DATA OUT signal at a relatively low frequency, the voltage level of variable voltage level line driver 430 may be decreased to, for example, +1.6 volts, thereby saving power.

Variable voltage level line driver 430 may be any one of a variety of known line driver circuits, such as an non-inverting buffer, or a simple inverter. For example, variable voltage level line driver 430 may be a conventional CMOS inverter comprising a P-type transistor and a N-type transistor. By selectively applying a smaller (e.g., +1.6 volts) or a larger (e.g., +3.3 volt) voltage to the power supply rail of the CMOS inverter, the switching speed of the CMOS inverter output can be decreased or increased.

Variable level power sources 410 represent a plurality of power supply voltages that may be generated on-chip (internally) by SOC device 105, or may be provided by external power supplies, or both. In the illustrated embodiment, the exemplary values of +3.3 volts and +1.6 volts are selected for purposes of illustration only. Those skilled in the art will recognize that other voltage levels may also be chosen.

According to one embodiment of the present invention, the variable power supply voltage may be selectively applied to variable voltage level line driver 430 by switch 420. This may be done adjustably by switching the variable power supply voltage between different discreet levels (i.e., +3.3 volts and +1.6 volts) using the SWITCH SELECT control signal from processor core 110. Alternatively, this may be done on a permanent basis (according to the specific application) when SOC device 105 is embedded in a circuit board and the position of switch 420 is selected by an external voltage coupled to the SWITCH SELECT control signal line.

In still another embodiment, the variable power supply voltage may be varied through a range of voltage levels by the LEVEL SELECT control signal. In such an embodiment, switch 420 (optionally) may be omitted and the output of variable voltage power sources 410 may be coupled directly to the power supply rail of variable voltage level line driver 430. The LEVEL SELECT control signal generated by processor core 110 may be a N-bit signal capable of adjusting the output of variable voltage power sources 410 to any one of $2^N$ voltage levels. Alternatively, the LEVEL SELECT control signal generated by processor core 110 may be an analog signal capable of adjusting the output of variable voltage power sources 410 to any level in a continuous range between a predetermined minimum level and a predetermined maximum value.

According to an advantageous embodiment of the present invention, processor core 110 sets the position of switch 420 using the SWITCH SELECT signal, or adjusts the output level of variable voltage power sources 410 using the LEVEL SELECT signal, by executing output voltage control program 440 stored in memory 440. Output voltage control program 440 may determine the appropriate voltage level on the scaled DATA OUT signal at the output of variable voltage level line driver 430 according to the frequency of the scaled DATA OUT signal. If variable voltage level line driver 430 must drive the scaled DATA OUT signal at a high data rate, output voltage control program 440 can increase the voltage level supplied to the power supply rail of variable voltage level line driver 430 by making an appropriate adjustment to the value of the LEVEL SELECT signal. When it is no longer necessary to drive the scaled DATA OUT signal at a high data rate, output voltage control program 440 can decrease the voltage level by adjusting the value of the LEVEL SELECT signal voltage, thereby saving power. It is noted that output voltage control program 440 need not be a stand alone program, but may instead be a sub-routine in a larger application program.

For example, if SOC device 105 is part of a cellular telephone and the scaled DATA OUT signal drives the transceiver portion of the cellular telephone, the voltage level supplied to the power supply rail of variable voltage level line driver 430 may be kept low during time periods when the cellular phone is accessing the wireless network but not actively conducting a phone call. During such an idle period, the cellular phone may only transmit intermittent acknowledgment signals at a low data rate to the wireless network to indicate that the cellular phone is still available on the network to receive calls. Since the data rate is low, output voltage control program 440, which may be part of the operating system program of the cellular phone, reduces power consumption by reducing the voltage on variable voltage level line driver 430. The unscaled DATA OUT signal is then driven at a lower bit rate.

However, at some point, the cellular phone may receive an incoming call or may initiate an outgoing call. When this occurs, output voltage control program 440 increases the power supply voltage applied to variable voltage level line driver 430 so that the scaled DATA OUT signal has faster switching times (i.e., faster rise times and faster fall times). The unscaled DATA OUT signal is accordingly driven at a higher bit rate to handle the voice and/or data traffic transmitted to the transmitter portion of the cellular phone.

The noise margins in SOC device 105 are determined in part by the voltage levels of the power supply rails therein. A lower supply voltage level reduces the noise margin in the components in SOC device 105. This reduced noise margin is adversely affected by, among other things, ground bounce and power supply noise caused by the ON-OFF switching of P-type and N-type transistors in line drivers in SOC device 105. In a complementary metal-oxide-silicon (CMOS) field effect transistor (FET) inverter driving a signal line, the P-type and N-type transistors of the CMOS inverter are both briefly ON during the transition from Logic 0 to Logic 1, and vice versa. This causes current spikes between ground and the power supply, resulting in noise. A rapid transition from Logic 0 to Logic 1 causes overshoots and ringing on the leading edge of a Logic 1 pulse. The present invention provides an improved line driver circuit capable of reducing the power supple noise and ground bounce in SOC device 105.

Figure 5:
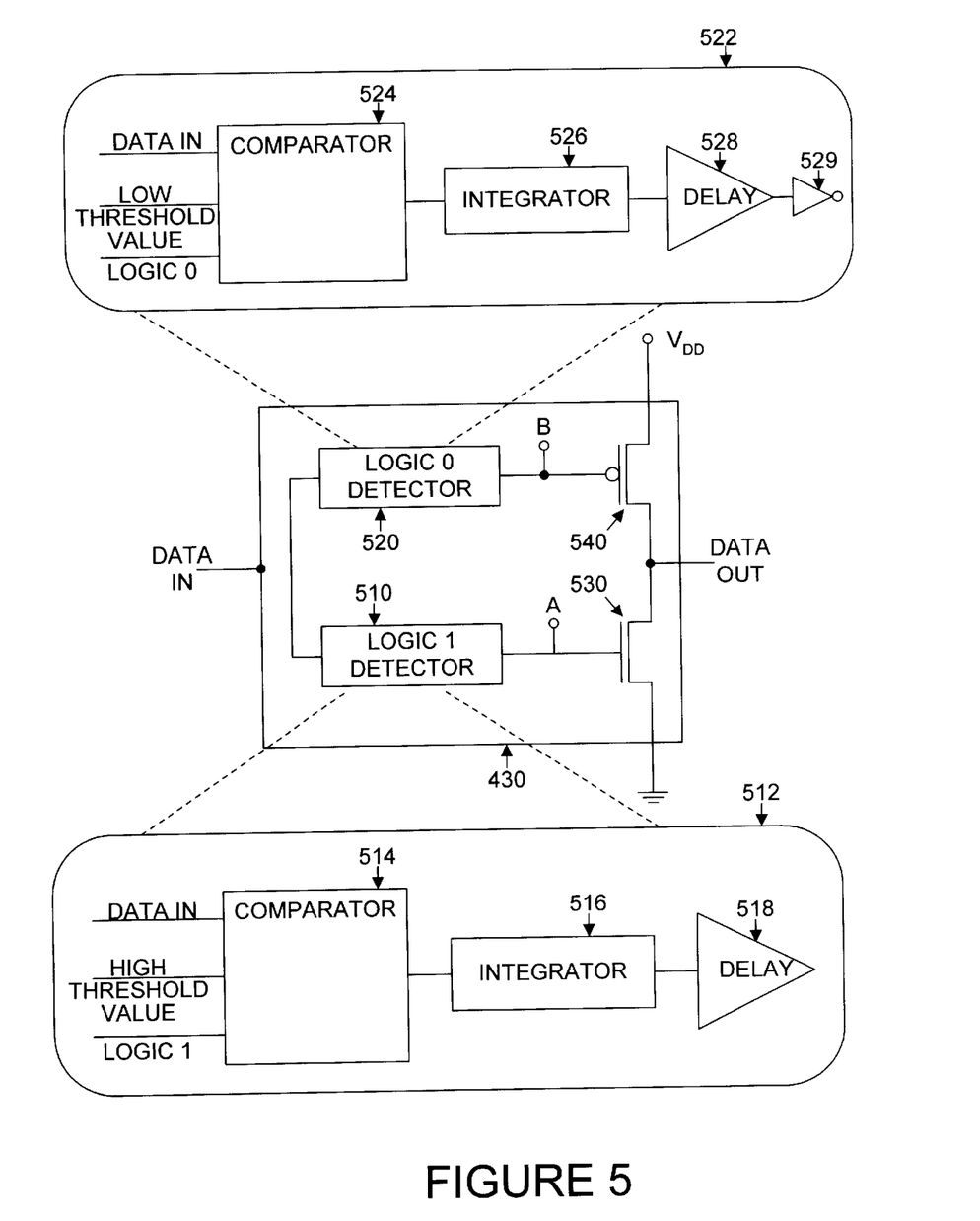
FIG. 5 illustrates a variable voltage line driver in greater detail according to an exemplary embodiment of the present invention.
Figure 6:
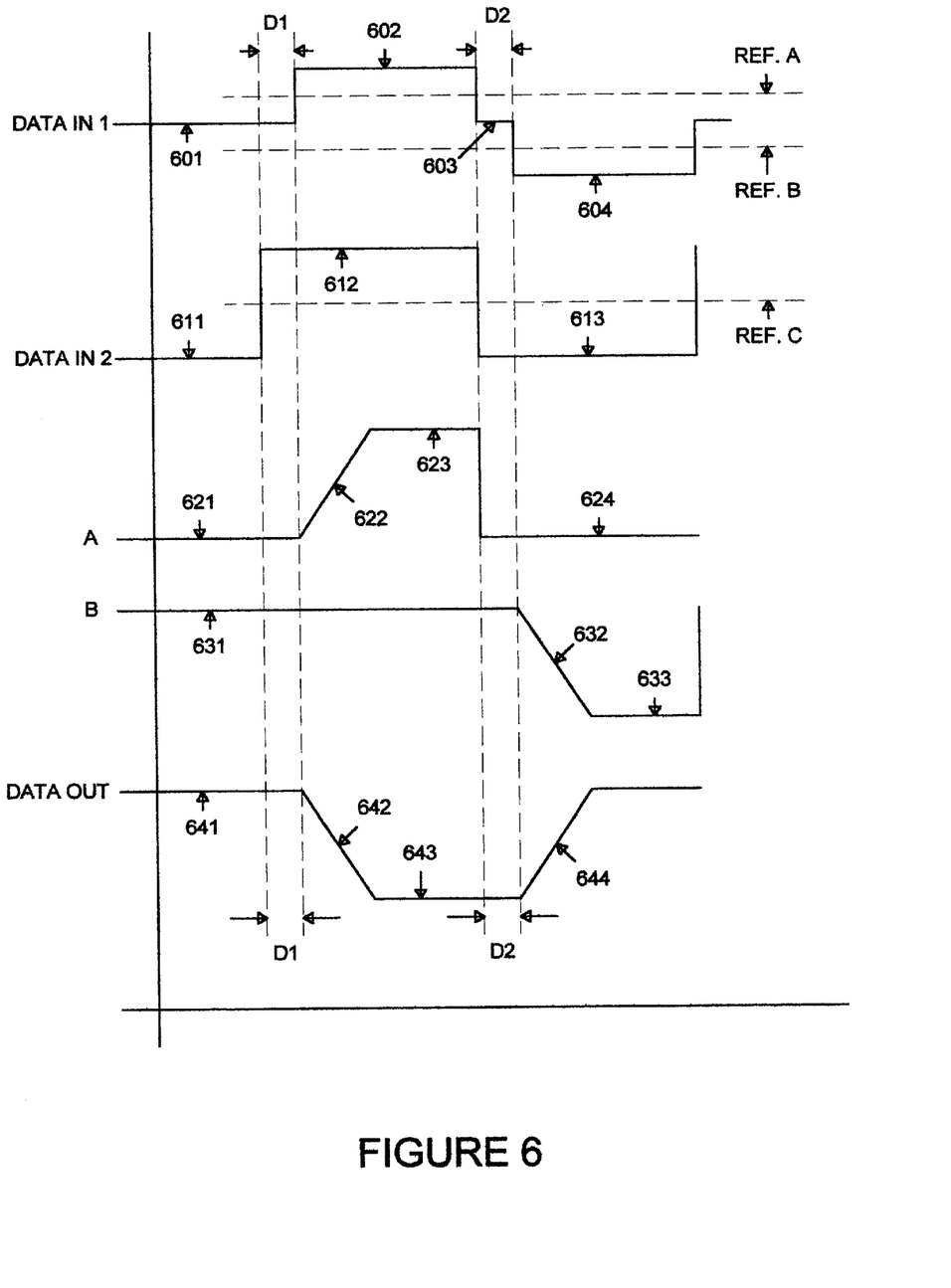
FIG. 6 is a timing diagram of important signals illustrating the operation of the variable voltage line driver according to exemplary embodiments of the present invention.

FIG. 5 illustrates variable voltage line driver 430 in greater detail according to an exemplary embodiment of the present invention. FIG. 6 is a timing diagram of important signals illustrating the operation of variable voltage line driver 430 according to exemplary embodiments of the present invention. Variable voltage line driver 430 comprises Logic 1 detector 510, Logic 0 detector 520, N-type transistor 530, and P-type transistor 540. P-type transistor 540 has a source coupled to the VDD power supply rail and a drain coupled to the DATA OUT signal line. N-type transistor 530 has source coupled to ground and a drain coupled to the DATA OUT signal line.

P-type transistor 540 and N-type transistor 530 are connected similarly to a conventional CMOS inverter, except that the gates of P-type transistor 540 and N-type transistor 530 are not connected together. Instead, the gate of P-type transistor 540 (test point B) is coupled to the output of Logic 0 detector 520 and the gate of N-type transistor 530 is coupled to the output of Logic 1 detector 510. As will be described below in greater detail, variable voltage line driver 430 operates as an inverting line driver.

The critical feature of Logic 1 detector 510 is that it applies waveform A in FIG. 6 to the gate of N-type transistor 530 (test point A) in FIG. 5. Waveform A turns N-type transistor 530 slowly ON and rapidly OFF. The critical feature of Logic 0 detector 520 is that it applies waveform B in FIG. 6 to the gate of P-type transistor 540 (test point B) in FIG. 5. Waveform B turns P-type transistor 540 slowly ON and rapidly OFF. It is a further critical feature of the operations of Logic 1 detector 510 and Logic 0 detector 520 that N-type transistor 530 and P-type transistor 540 are never ON at the same time.

Those skilled in the art will recognize that the foregoing may be achieved in different ways, depending on the type of circuitry in Logic 1 detector 510 and Logic 0 detector 520. Logic 1 detector 510 and Logic 0 detector 520 may include delay elements that are triggered on transitions from Logic 0 to Logic 1, and vice versa. Alternatively, the waveform DATA IN may include guard barriers between Logic 1 periods and Logic 0 periods that prevent N-type transistor 530 and P-type transistor 540 are never ON at the same time.

In a first exemplary embodiment of the present invention, the DATA IN 1 signal in FIG. 6 is applied to the inputs of Logic 1 detector 510 and Logic 0 detector 520. In this first exemplary embodiment as shown in circle 512, Logic 1 detector 510 comprises a comparator 514 that detects when the DATA IN 1 signal rises above a high threshold voltage. This is shown as a dotted line label Reference A (REF. A) in FIG. 6. Logic 0 detector 520, as shown in circle 522, comprises a comparator 524 that detects when the DATA IN 1 signal falls below a low threshold voltage. This is shown as a dotted line label Reference B (REF. B) in FIG. 6.

Initially, the DATA IN 1 signal is at a zero reference voltage (item 601) between the Reference A and Reference B levels. At this point, the output of Logic 1 detector 510 (waveform A) is at Logic 0 (item 621) and the output of Logic 0 detector 520 is at Logic 1 (item 631). Next, the DATA IN 1 signal goes to a Logic 1 by rising above the Reference A level (item 602). Logic 1 detector 510 detects the Logic 1 and the output of Logic 1 detector 510 ramps up relatively slowly (item 622) to a Logic 0 (item 623). The output of Logic 1 detector 510 turns on N-type transistor 530 and the DATA OUT signal, which is initially Logic 1 (item 641), ramps down (item 642) to Logic 0 (item 643). Since the output of Logic 1 detector 510 and the DATA OUT signal are not vertical pulses, overshoots and ringing caused by the leading edges of vertical pulse do not occur. This reduces noise in SOC device 105.

Next, the DATA IN 1 signal returns to the zero reference voltage (item 603) during a guard period (shown as delay period D2). Logic 1 detector 510 detects that the Logic 1 is gone and the output of Logic 1 detector 510 drops vertically to a Logic 0 (item 624). The output of Logic 1 detector 510 turns off N-type transistor 530 and the DATA OUT signal remains at Logic 0 (item 643) during delay period D2.

Next, the DATA IN 1 signal goes to a Logic 0 by falling below the Reference B level (item 604). Logic 0 detector 520 detects the Logic 0 and the output of Logic 0 detector 520 down relatively slowly (item 632) to a Logic 0 (item 633). The output of Logic 0 detector 520 turns on P-type transistor 540 and the DATA OUT signal ramps up (item 644) to Logic 1 again.

Those skilled in the art will recognize that Logic 1 detector 510 may use a number of different circuits to achieve a relatively slow ramp up from Logic 0 to Logic 1 and a rapid switch OFF from Logic 1 to Logic 0. For example, Logic 1 detector 510 may comprise an integrator circuit 516 and delay elements 518 that are driven by a step function on the output of comparator 514 in Logic 1 detector 510. When the step output of comparator 514 goes from Logic 0 to Logic 1, the output of integrator circuit 516 is a ramp function. An exemplary integrator may comprise a transistor that operates as a constant current source to charge a capacitor. The voltage on the capacitor is a ramp function whose slope varies in steepness according to the value of the capacitance. When the input to Logic 1 detector 510 switches from Logic 1 back to Logic 0, the output of comparator 514 may activate a switch that shorts the capacitor to ground. This causes a rapid transition from Logic 1 to Logic 0 at the output of Logic 1 detector 510.

Additionally, those skilled in the art will recognize that Logic 0 detector 520 may be implemented in a manner that is nearly identical to Logic 1 detector 510, including an integrator circuit 526 and delay elements 528. The primary difference would be the inclusion of a final inverter stage 529 at the output of Logic 0 detector 520.

In a second exemplary embodiment of the present invention, the DATA IN 2 signal in FIG. 6 may be applied to the inputs of Logic 1 detector 510 and Logic 0 detector 520. The DATA IN 2 signal does not include guard periods between Logic 1 and Logic 0 states. In this second exemplary embodiment, Logic 1 detector 510 comprises a comparator that detects when the DATA IN 2 signal rises above a zero reference voltage. This is shown as a dotted line label Reference C (REF. C) in FIG. 6. Logic 0 detector 520 comprises a comparator that detects when the DATA IN 2 signal falls below the Reference C (REF. C) level.

In this second exemplary embodiment, the DATA IN signal switches from Logic 0 to Logic 1, and vice versa without a guard period. To prevent N-type transistor 530 and P-type transistor 540 from both being ON at the same time, Logic 0 detector 520 and Logic 1 detector 510 may comprise delay elements coupled to the outputs of the internal comparators that prevent the ramp portions of waveform A and waveform B from occurring immediately after a Logic 0 to Logic 1 transition at the outputs of the comparators. This causes delay periods D1 and D2. The delay elements may be bypassed after a Logic 1 to Logic 0 transition at the outputs of the comparators in order to ensure that N-type transistor 530 and P-type transistor 540 turn OFF rapidly and without delay.

Although the present invention has been described in detail, those skilled in the art should understand that they can make various changes, substitutions and alterations herein without departing from the spirit and scope of the invention in its broadest form.

What is claimed is:

1. For use in an integrated circuit, a reduced-noise line driver for driving a signal line in said integrated circuit comprising:

an N-type transistor having a source coupled to ground and a drain coupled to said signal line;

a P-type transistor having a source coupled to a power supply rail and a drain coupled to said signal line;

a first controller having an input for receiving an incoming signal and an output coupled to a gate of said N-type transistor; and a second controller having an input for receiving said incoming signal and an output coupled to a gate of said P-type transistor;

wherein said first controller and said second controller selectively switch said N-type transistor and said P-type transistor ON and OFF such that said N-type transistor and said P-type transistor are never ON simultaneously when either of said N-type transistor and said P-type transistor is switching from OFF to ON in response to a change in a logic level of said incoming signal;

wherein said first controller comprises a comparator capable of determining when said incoming signal is a LogicFig.1 and, in response to said determination, turning ON said N-type transistor;

wherein said first controller further comprises circuitry for turning ON said N-type transistor using a ramp function.

2. The reduced noise line driver as set forth in claim 1 wherein said first controller further comprises delay circuitry for delaying said ramp function by a predetermined delay period after said comparator has determined said incoming signal is a LogicFig.1.

3. The reduced noise line driver as set forth in claim 1 wherein said first controller further comprises delay circuitry for delaying said ramp function by a predetermined delay period after said incoming signal has switched from a LogicFig.0 to a LogicFig.1.

4. The reduced noise line driver as set forth in claim 1 wherein said second controller comprises a comparator capable of determining when said incoming signal is a LogicFig.0 and, in response to said determination, turning ON said P-type transistor.

5. The reduced noise line driver as set forth in claim 4 wherein said second controller further comprises circuitry for turning ON said P-type transistor using a ramp function.

6. The reduced noise line driver as set forth in claim 5 wherein said second controller further comprises delay circuitry for delaying said ramp function by a predetermined delay period after said comparator has determined said incoming signal is a LogicFig.0.

7. The reduced noise line driver as set forth in claim 5 wherein said second controller further comprises delay circuitry for delaying said ramp function by a predetermined delay period after said incoming signal has switched from a LogicFig.1 to a LogicFig.0.

8. A system-on-a-chip (SOC) circuit comprising:
    a plurality of bus devices, each of said bus devices capable of transmitting data to a target one of said plurality of bus devices and receiving data from said target bus device;
    a bus interface unit coupled to each of said plurality of bus devices, wherein said bus interface unit is capable of transmitting data between said plurality of bus devices;
    a reduced-noise line driver disposed in at least one of said plurality of devices and said bus interface device capable of receiving an incoming data signal and transmitting an outgoing data signal on a signal line in said SOC circuit, said reduced noise line driver comprising:
        an N-type transistor having a source coupled to ground and a drain coupled to said signal line;
        a P-type transistor having a source coupled to a power supply rail and a drain coupled to said signal line;
        a first controller having an input for receiving an incoming signal and an output coupled to a gate of said N-type transistor; and
        a second controller having an input for receiving said incoming signal and an output coupled to a gate of said P-type transistor.
    wherein said first controller and said second controller selectively switch said N-type transistor and said P-type transistor ON and OFF such that said N-type transistor and said P-type transistor are never ON simultaneously when either of said N-type transistor and said P-type transistor is switching from OFF to ON in response to a change in a logic level of said incoming signal;

wherein said first controller comprises a comparator capable of determining when said incoming signal is a LogicFig.1 and, in response to said determination, turning ON said N-type transistor;

wherein said first controller further comprises circuitry for turning ON said N-type transistor using a ramp function.

9. The system-on-a-chip (SOC) circuit as set forth in claim 8 wherein said first controller further comprises delay circuitry for delaying said ramp function by a predetermined delay period after said comparator has determined said incoming signal is a LogicFig.1.

10. The system-on-a-chip (SOC) circuit as set forth in claim 8 wherein said first controller further comprises delay circuitry for delaying said ramp function by a predetermined delay period after said incoming signal has switched from a LogicFig.0 to a LogicFig.1.

11. The system-on-a-chip (SOC) circuit as set forth in claim 8 wherein said second controller comprises a comparator capable of determining when said incoming signal is a LogicFig.0 and, in response to said determination, turning ON said P-type transistor.

12. The system-on-a-chip (SOC) circuit as set forth in claim 11 wherein said second controller further comprises circuitry for turning ON said P-type transistor using a ramp function.

13. The system-on-a-chip (SOC) circuit as set forth in claim 12 wherein said second controller further comprises delay circuitry for delaying said ramp function by a predetermined delay period after said comparator has determined said incoming signal is a LogicFig.0.

14. The system-on-a-chip (SOC) circuit as set forth in claim 12 wherein said second controller further comprises delay circuitry for delaying said ramp function by a predetermined delay period after said incoming signal has switched from a LogicFig.1 to a LogicFig.0.

15. For use in a line driver circuit having an output stage comprising 1) an N-type transistor having a source coupled to ground and a drain coupled to the signal line; and 2) a P-type transistor having a source coupled to a power supply rail and a drain coupled to the signal line, a method for driving the output stage comprising the step of selectively switching the N-type transistor and the P-type transistor ON and OFF such that the N-type transistor and the P-type transistor are never ON simultaneously when either of said N-type transistor and said P-type transistor is switching from OFF to ON in response to a change in a logic level of said incoming signal;

wherein the step of selectively switching comprises the substeps of:
        determining when an incoming signal has switch from a LogicFig.0 to a LogicFig.1; and in response to the determination, first turning OFF the P-type transistor and then turning ON the N-type transistor.

16. The method as set forth in claim 15 wherein the step of selectively switching comprises the sub steps of:
    determining when an incoming signal has switch from a LogicFig.1 to a LogicFig.0; and
    in response to the determination, first turning OFF the N-type transistor and then turning ON the P-type transistor.

* * * * *